US011978702B2

(12) United States Patent
Zhao et al.

(10) Patent No.: US 11,978,702 B2
(45) Date of Patent: May 7, 2024

(54) SIMULTANEOUS SELF-FORMING HEA BARRIER AND Cu SEEDING LAYERS FOR Cu INTERCONNECT

(71) Applicant: SiEn (QingDao) Integrated Circuits Co., Ltd., Shandong (CN)

(72) Inventors: Yong Zhao, Qingdao (CN); Zhaosheng Meng, Qingdao (CN); Min-Hwa Chi, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 309 days.

(21) Appl. No.: 17/702,619

(22) Filed: Mar. 23, 2022

(65) Prior Publication Data

US 2022/0319999 A1     Oct. 6, 2022

(30) Foreign Application Priority Data

Apr. 1, 2021   (CN) .......................... 202110357114.1

(51) Int. Cl.
*H01L 23/532*     (2006.01)
*H01L 21/768*     (2006.01)

(52) U.S. Cl.
CPC .. *H01L 23/53238* (2013.01); *H01L 21/76843* (2013.01); *H01L 21/76879* (2013.01)

(58) Field of Classification Search
CPC ......... H01L 23/53238; H01L 21/76843; H01L 21/76879; H01L 21/76864; H01L 21/76867; H01L 21/76873; H01L 21/76831; H01L 21/76834; H01L 23/5386
See application file for complete search history.

(56) References Cited

FOREIGN PATENT DOCUMENTS

CN         108336062 A       7/2018

OTHER PUBLICATIONS

Peng et al., "Effect of high entropy alloys TiVCrZrHf barrier layer on microstructure and texture of Cu thin films", Materials Letters, 2018, pp. 5-8, vol. 230.
Hsiao et al., "Thermodynamic route for self-forming 1.5 nm V—Nb—Mo—Ta—W high-entropy alloy barrier layer: Roles of enthalpy and mixing entropy", Acta Materialia, 2020, pp. 107-115, vol. 199.
Kumar et al., "Diffusion barrier with 30-fold improved performance using AlCrTaTiZrN high-entropy alloy", Journal of Alloys and Compounds, 2020, pp. 1-5, 151755, vol. 814.

(Continued)

*Primary Examiner* — Robert G Bachner
(74) *Attorney, Agent, or Firm* — Chen Yoshimura LLP

(57) ABSTRACT

A Cu interconnect having a diffusion barrier formed with the self-formed high-entropy alloy a method of preparing the same are provided. A high-entropy alloy and Cu are deposited together. When annealing, a diffusion barrier is formed through segregation of the high-entropy alloy may, toward a bottom and a sidewall of an interconnect via, and a Cu seed layer is formed through segregation of Cu at an outer surface of the diffusion barrier, so as to simultaneously self-form the diffusion barrier formed with the self-formed high-entropy alloy and the Cu seed layer. The Cu interconnect having a diffusion barrier formed with the self-formed high-entropy alloy comprises: a base, the self-formed diffusion barrier formed with the self-formed high-entropy alloy and the Cu seed layer and a Cu electroplating layer electroplating on the Cu seed layer.

10 Claims, 3 Drawing Sheets

(56) References Cited

OTHER PUBLICATIONS

Tsai et al., "Diffusion barrier properties of AlMoNbSiTaTiVZr high-entropy alloy layer between copper and silicon", Thin Solid Films, 2008, pp. 5527-5530, vol. 516.
Hruska et al., "Oxidation of amorphous HfNbTaTiZr high entropy alloy thin films prepared by DC magnetron sputtering", Journal of Alloys and Compounds, https://doi.org/10.1016/j.jallcom, 2020, 157978.
Biljakovic et al., "Electronic structure and properties of (TiZrNbCu)1-xNix high entropy amorphous alloys", Journal of Alloys and Compounds, 2017, pp. 2661-2668, vol. 695.
An et al., "Amorphous TaxMnyOz Layer as a Diffusion Barrier for Advanced Copper Interconnects", Scientific Reports, 2019, 9-20132.
Tsau et al., "The Low Electrical Resistivity of the High-entropy Alloy Oxide Thin Films", Procedia Engineering, 2012, 36(1):246-252.
Chang et al., "4-nm thick multilayer structure of multi-component (AlCrRuTaTiZr)Nx as robust diffusion barrier for Cu interconnects", Journal of Alloys and Compounds, 2012, 515:4-7.
Dai et al., "Theoretical investigation of the phase stability and elastic properties of TiZrHfNb-based high entropy alloys", Materials & Design, 2019, pp. 1-8, vol. 182, 108033.

SIMULTANEOUS SELF-FORMING HEA BARRIER AND Cu SEEDING LAYERS FOR Cu INTERCONNECT

FIELD OF THE INVENTION

The present invention relates to semiconductor devices, and especially relates to a Cu interconnect and a method of preparing a Cu interconnect having a diffusion barrier formed with a self-formed high-entropy alloy.

BACKGROUND OF THE INVENTION

Along with development of integrated circuit technology, a feature size of an integrated circuit is getting reduced, and in light of this tendency, it is needed to form a diffusion barrier that maintains diffusion barrier performance, thermal stability and low resistivity as thin as possible. Traditional copper interconnects have a problem of RC delay which deteriorate performance of a device. Nowadays, the copper interconnects gradually replace aluminum interconnects due to its low resistivity and high anti-migration. Although the copper interconnects have good physical characteristics, some inevitable problems exist, for example, diffusion generating between copper and silicon, and bad adhesion between copper and other materials, prone to oxidation, severe affecting performance of the device. As such, a diffusion barrier with good thermal stability, conductivity and adhesion must be introduced into the copper interconnects.

In a current process performed after a copper interconnect process, a diffusion barrier of an integrated circuit is prepared with performing a physical vapor deposition (PVD) technology to form a barrier layer on a base at first, and then a copper seed layer is deposited, and then through performing a copper electrical chemical plating (ECP) technology, interconnect vias are filled with the Cu interconnects on the copper seed layer, and eventually the Cu interconnects are annealed. The process flow is complex with high cost and low efficiency.

SUMMARY OF THE INVENTION

In light of aforesaid problems in the current technologies, an object of the present invention is to provide a method of preparing a Cu interconnect having a diffusion barrier formed with the self-formed high-entropy alloy which solves the problems of complex process flow, high production cost and low efficiency in the current technologies, and prepare a diffusion barrier formed with a self-formed high-entropy alloy which has good thermal stability, low resistivity and high adhesion to the base.

An aspect of the present invention provides a method of preparing a Cu interconnect having a diffusion barrier formed with the self-formed high-entropy alloy, comprising steps of: providing a base, the base having a pre-depositing area; preparing a co-deposition material layer at the pre-depositing area, the co-deposition material layer is formed through co-depositing high-entropy alloy elements and Cu element; annealing the co-deposition material layer to simultaneously and automatically form the diffusion barrier formed with the self-formed high-entropy alloy and the Cu seed layer, wherein the diffusion barrier formed with the self-formed high-entropy alloy is formed on a surface of the pre-depositing area, the Cu seed layer is formed on a surface of the diffusion barrier formed with the self-formed high-entropy alloy; and electroplating the Cu seed layer to form a Cu electroplating layer to prepare the Cu interconnect.

Optionally, the step of preparing the co-deposition material layer may further comprise: performing physical vapor deposition to co-deposit a membrane at the pre-depositing area with a high-entropy target and the Cu target.

Optionally, the high-entropy target may be prepared through a hot isostatic pressing process.

Optionally, an annealing temperature may be within 300-400° C.

Optionally, the step of annealing the co-deposition material layer may be performed with a quick annealing furnace for rapid thermal annealing, and an annealing cooling rate may be within 50~100° C./s.

Optionally, an interconnect via may be formed in the base, and the pre-depositing area may be constructed with at least a sidewall of the interconnect via.

Another aspect of the present invention provides a Cu interconnect having a diffusion barrier formed with a self-formed high-entropy alloy, comprising: a base, having a pre-depositing area; a diffusion barrier formed with the self-formed high-entropy alloy, self-formed at a surface of the pre-depositing area; a Cu seed layer, formed at a surface of the diffusion barrier formed with the self-formed high-entropy alloy; and a Cu electroplating layer, formed on the Cu seed layer to form the Cu interconnect.

Optionally, a thickness of the diffusion barrier formed with the self-formed high-entropy alloy may be within 1-2 nm.

Optionally, the diffusion barrier formed with the self-formed high-entropy alloy may be an amorphous solid solution.

Optionally, the diffusion barrier formed with a material of the self-formed high-entropy alloy may be chosen from the group comprising TiVCrZrHf, VNbMoTaW, HfNbTaTiZr, $(TiZrNbCu)_{1-x}Ni_x$, AlMoNbSiTaTiVZ.

As mentioned above, the Cu interconnect having a diffusion barrier formed with the self-formed high-entropy alloy and the method of preparing the same may simultaneously self-form the diffusion barrier formed with the self-formed high-entropy alloy and the Cu seed layer, so as to provide a simple process flow with higher efficiency and reduced cost to facilitate industrial production. The prepared diffusion barrier formed with the self-formed high-entropy alloy may be smaller in sizes to facilitate application of Cu in interconnect of integrated circuits to satisfy requirements of manufacturing micro-electronical productions.

BRIEF DESCRIPTION OF THE DRAWINGS

Various objects and advantages of the present invention will be more readily understood from the following detailed description when read in conjunction with the appended drawing as follows.

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

It should be noted that the drawings provided here are only for examples but not limited to the specific number or scale shown therein. When implementing the examples according to the drawings, condition, number, shape, size, relative position and proportion of each element may be changed and arrangement of the elements may be in a more complex way.

First Embodiment

During preparation of a Cu interconnect, a high-entropy alloy may be used as a diffusion barrier for chemical inert between some refractory metal elements (such as Ti, Zr, Mo and Ta, etc.), nitride (TiN, TaN) and copper; however, because these materials are oftentimes of polycrystalline structure to provide copper atoms diffusion channels that deteriorate barrier performance. When overlapped layers is formed in the diffusion barrier, such as Ta/TaN, Ru/TaN, grain boundaries may be elongated, and the grain boundaries or interfaces may be mismatched to make diffusion of the copper atoms difficult, but the diffusion barrier structured in the overlapped layers may increase resistivity due to its greater thickness, compared with a single layer of diffusion barrier. As such, a thin diffusion barrier may not be formed even through a PVD process. A new material of a high-entropy alloy is usually formed by at least five compositions which present their characteristics as a whole. Effects of high-entropy, lattice distortion, sluggish diffusion and cocktail especially shown by the high-entropy alloy may assist in presenting good adhesion, thermal stability and barrier performance. Therefore, the high-entropy alloy may be served as the diffusion barrier in a copper interconnect to prevent from oxidation of a Cu membrane and diffusion of the Cu atoms and satisfy requirements of ultra-thinned diffusion barrier.

Figure 1:
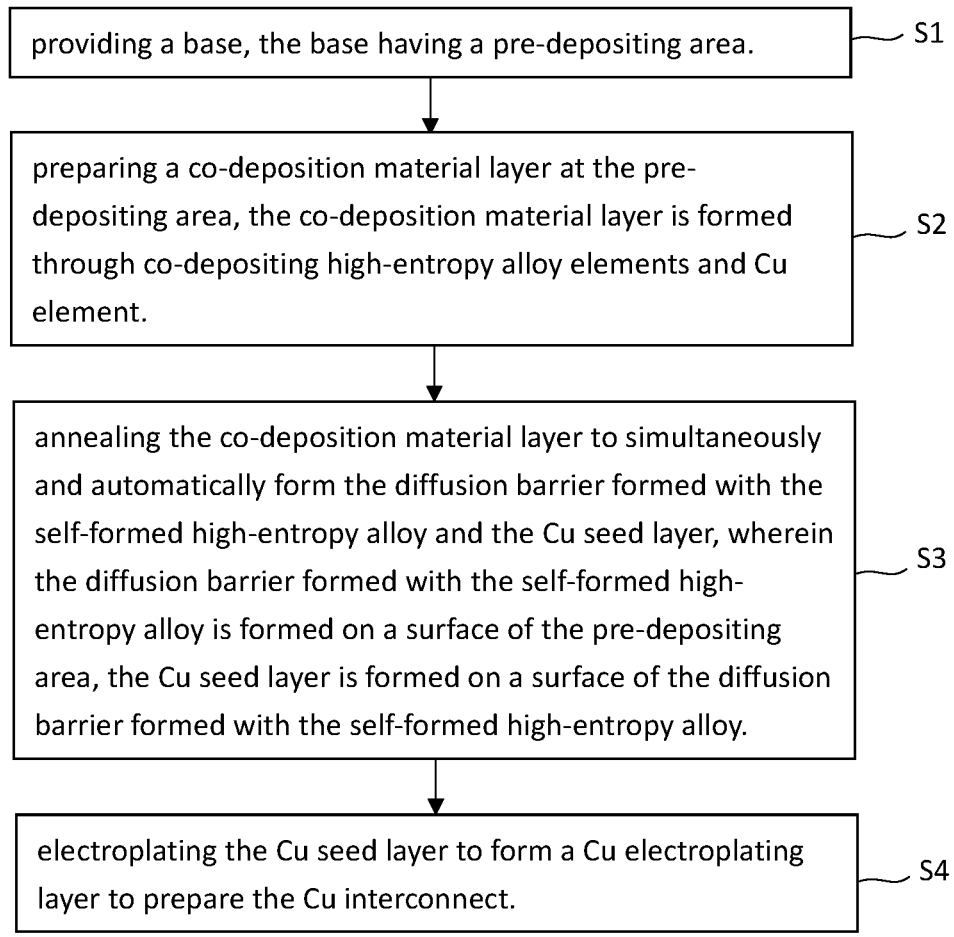
FIG. 1 shows a flow chart of a method of preparing a Cu interconnect having a diffusion barrier formed with the self-formed high-entropy alloy according to a first embodiment of the present invention.

As shown in FIG. 1, a flow chart of a method of preparing a Cu interconnect having a diffusion barrier formed with the self-formed high-entropy alloy according to a first embodiment of the present invention is provided. The method mainly comprises steps of: step S1: providing a base, the base having a pre-depositing area; step S2: preparing a co-deposition material layer at the pre-depositing area, the co-deposition material layer is formed through co-depositing high-entropy alloy elements and Cu element; step S3: annealing the co-deposition material layer to simultaneously and automatically form the diffusion barrier formed with the self-formed high-entropy alloy and the Cu seed layer, wherein the diffusion barrier formed with the self-formed high-entropy alloy is formed on a surface of the pre-depositing area, the Cu seed layer is formed on a surface of the diffusion barrier formed with the self-formed high-entropy alloy; and step S4: electroplating the Cu seed layer to form a Cu electroplating layer to prepare the Cu interconnect.

Figure 2:
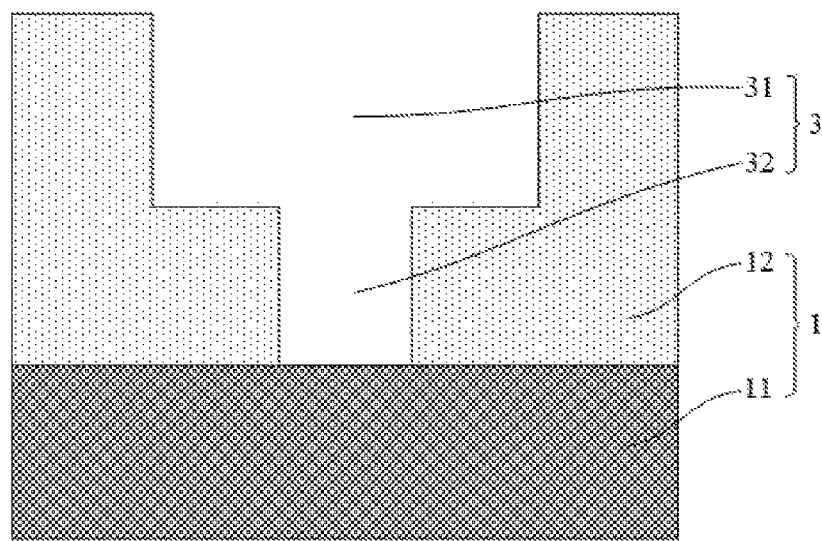
FIG. 2 shows a cross-sectional view of a base in a step S1 in the flow chart of a method of preparing a Cu interconnect having a diffusion barrier formed with the self-formed high-entropy alloy according to the first embodiment of the present invention.

Specifically, in the step S1, referring to FIG. 2 which shows a structure of a base, a base 1 may comprise a substrate 11, a dielectric layer 12 formed on a surface of the substrate 11, and an interconnect via 3 formed in the dielectric layer 12. A pre-depositing area may be formed by at least a sidewall of the interconnect via 3, such as a bottom the sidewall of the interconnect via 3 constructing the pre-depositing area.

Preferably, the substrate 11 may comprise a Si material. To obtain a clean Si substrate, it is needed to ultra-sonically clean the Si substrate in acetone, absolute ethanol and de-ionized water sequentially for a while respectively to remove surface oxidations and impurities, dry the cleaned Si substrate, and then put the dried Si substrate in a vacuumed room with introducing Ar air as working gas and keeping a stable pressure therein to clean residual surface impurities on the Si substrate with reverse sputtering and pre-sputtering cleaning processes.

Preferably, the dielectric layer 12 may comprise but be not limited to low-k dielectric material, such as $SiO_2$ material.

Specifically, the interconnect via 3 may be formed in the dielectric layer through a dry etching process or a wet etching process. The interconnect via 3 may comprise a groove 31 and a through hole 32. The groove 31 may be positioned above the through hole 32 and connected to through hole 32. A width of the groove 31 may be greater than a width of the through hole 32. The interconnect via 3 may be exposed from the substrate 11.

Figure 3:
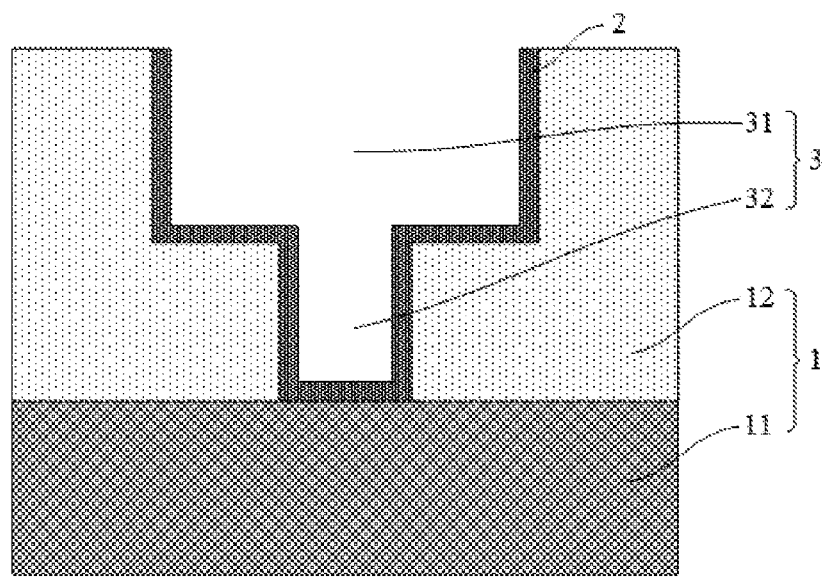
FIG. 3 shows a cross-sectional view of a structure in a step S2 in the flow chart of a method of preparing a Cu interconnect having a diffusion barrier formed with the self-formed high-entropy alloy according to the first embodiment of the present invention.

Specifically, in the step S2, referring to FIGS. 1 and 3, the step of preparing the co-deposition material layer 2 may be implemented as those comprising: with performing a PVD (physical vapor deposition) process, taking Ar as working air and keeping a pressure in the vacuum room stable, co-depositing a membrane at the pre-depositing area with a high-entropy target and a Cu target to deposit the high-entropy alloy and Cu together and ensure slightly doping of the high-entropy alloy in Cu in the deposited membrane. When the co-deposition membrane reaches a designed thickness, the high-entropy target and The Cu target, controlled magnetically, is turned-off, and an Ar gas inlet is turned off to stop deposition.

Specifically, aforesaid PVD process may apply a magnetic co-sputtering technology, plasma plating technology, vacuum evaporation technology and arc plasma plating technology, etc. and optionally may be replaced by a chemical vapor deposition (CVD) process.

Specifically, the high-entropy alloy may be a solid solution which may be formed by at least five compositions, such as at least five metal elements. Each element of the high-entropy alloy may be mixed according to a designed Mole ratio, constructed through the hot isostatic pressing process preparion, and may comprise but be not limited to: TiVCrZrHf, VNbMoTaW, HfNbTaTiZr, (TiZrNbCu)1-xNix and AlMoNbSiTaTiVZr, etc. Optionally, the high-entropy target used for preparing the diffusion barrier may be multicomponent metal nitride or multicomponent metal oxide, such as AlCrTaTiZrN, (AlCrRuTaTiZr)Nx and TaxMnyOz, etc.

Figure 4:
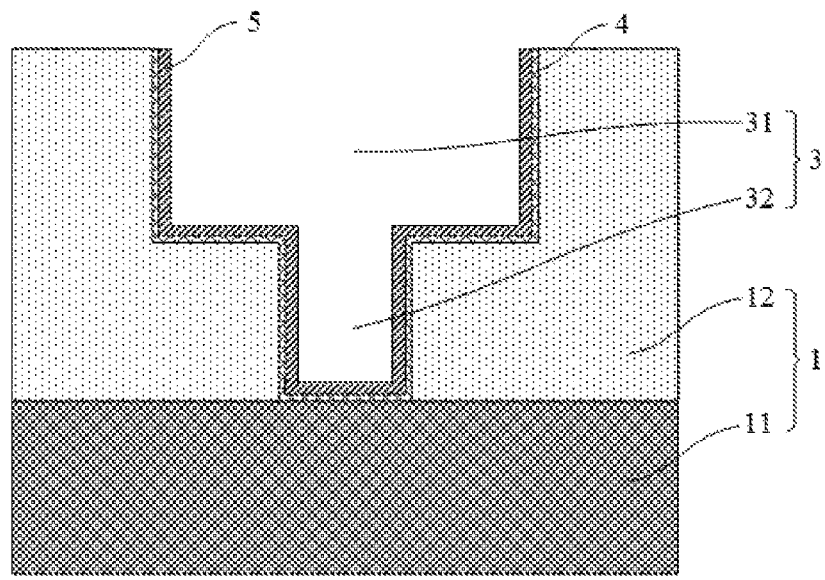
FIG. 4 shows a cross-sectional view of a structure in a step S3 in the flow chart of a method of preparing a Cu interconnect having a diffusion barrier formed with the self-formed high-entropy alloy according to the first embodiment of the present invention.

Specifically, in the step S3, referring to FIGS. 1 and 4, a low-temperature annealing process is performed to prepare the diffusion barrier formed with the self-formed high-entropy alloy 4 and the Cu seed layer 5, both of which are self-formed at the pre-depositing area. Details of the preparation are: positioning a sample in a vacuum furnace, performing a rapid thermal annealing (RTA) process at a temperature within 300~400° C. in a quick annealing furnace, and an annealing cooling rate is within 50~100° C./s; after the annealing, the sample is cooled along with the furnace, and then the self-formed diffusion barrier formed with the self-formed high-entropy alloy 4 and the Cu seed layer 5 are made.

It should be noted that during the annealing, the co-deposition membrane affected by Gibbs free energy, determined by entropy change and entropy change of mixing, may gradually segregate Cu and the high-entropy alloy, Cu (which present repulsive interaction with other elements) may migrate to an outer surface and then form the Cu seed layer 5, and the high-entropy alloy elements may form an interfacing segregation at a dielectric layer 12 and a substrate 11 in the interconnect via 3, so as to self-form the diffusion barrier formed with the self-formed high-entropy alloy 4. The new technology of the annealed self-formed diffusion barrier formed with the self-formed high-entropy alloy may carry out a simple process flow to control cost.

Specifically, during the annealing process, the Cu seed layer 5 may be self-formed, and meanwhile Cu lattices may be grown, and Cu lattice spacing and defects in the Cu seed layer 5 may be getting decreased, so as to densify a surface of the grown Cu seed layer 5 and ensure good conductivity of the Cu interconnect. Further, because a copper sputtering process forming the Cu seed layer 5 is not needed anymore, the process may be less to promote cost efficiency.

Figure 5:
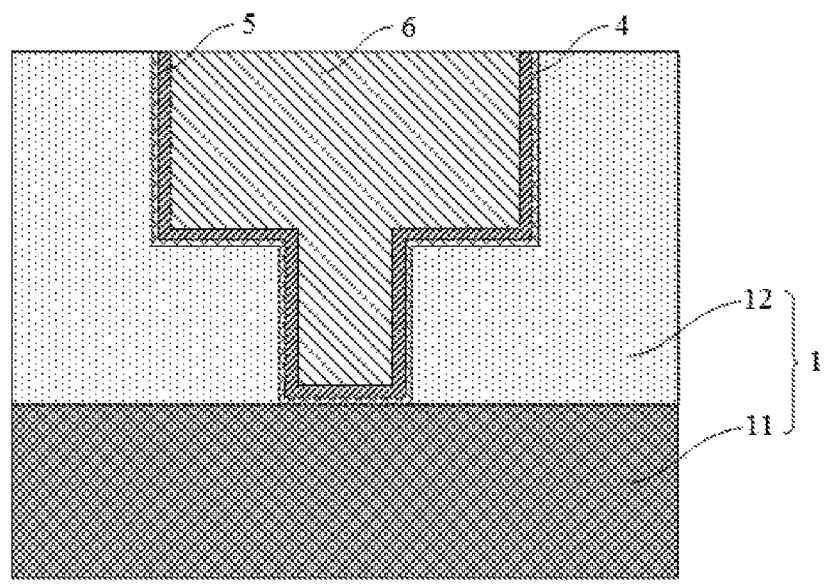
FIG. 5 shows a cross-sectional view of a Cu interconnect having a diffusion barrier formed with the self-formed high-entropy alloy according to the first embodiment and a second embodiment of the present invention.

Specifically, in the step S4, referring to FIGS. 1 and 5, a Cu plating process is performed to form the Cu electroplating layer 6 on the Cu seed layer 5 and the interconnect via 3 is filled with the Cu interconnect, and a structure at this time is show in FIG. 5. The Cu plating process may have benefits such as low cost, simplicity, independency from vacuum apparatus and high deposition efficiency, etc. Then, the Cu interconnect may be annealed. Finally, a chemical mechanical polish (CMP) process may be performed to planarize the Cu interconnect, and optionally, fixed abrasive CMP technology, electrical chemical mechanical planarization and plasma-assisted chemical etching planarization technology may be used to planarize the Cu interconnect.

In the present embodiment, a method of simultaneously self-forming the diffusion barrier formed with the self-formed high-entropy alloy and the Cu seed layer may be provided to from the co-deposition material layer having the high-entropy alloy, comprising several chemical elements, and Cu through a PVD or CVD process. Then, annealing at a low temperature (such as 300~400° C.) may be performed. At this time, the high-entropy alloy elements may form segregation at the bottom and the sidewall of the interconnect via as the diffusion barrier, and segregation of the Cu seed layer may be formed at an outer surface of the diffusion barrier. After finishing remaining process of forming Cu interconnect hereinafter, i.e. ECP and CMP processes, a good Cu interconnect may be prepared. Compared with traditional process having two steps to deposit a diffusion barrier and a Cu seed layer respectively, aforesaid process may simultaneously self-form the diffusion barrier formed with the self-formed high-entropy alloy and the Cu seed layer with a simple and efficient process and lower cost, that facilitates industrial production. The prepared diffusion barrier formed with the self-formed high-entropy alloy may be smaller in sizes to facilitate application of Cu in interconnect of integrated circuits to satisfy requirements of manufacturing micro-electronical productions.

Second Embodiment

As shown in FIG. 5, a cross-sectional view of a Cu interconnect having a diffusion barrier formed with the self-formed high-entropy alloy according to a second embodiment of the present invention is shown. A Cu interconnect having a diffusion barrier formed with self-formed high-entropy alloy may comprise: a base, the base having a pre-depositing area; a diffusion barrier formed with the self-formed high-entropy alloy, self-formed at a surface of the pre-depositing area; a Cu seed layer, formed at a surface of the diffusion barrier formed with the self-formed high-entropy alloy; and a Cu electroplating layer, formed on the Cu seed layer to form the Cu interconnect.

Specifically, the base 1 may comprise a substrate 11 and a dielectric layer 12. The dielectric layer 12 may be positioned at a surface of the substrate 11, a interconnect via 3 may be positioned in the dielectric layer 12, and the interconnect via may comprise a groove 31 and a through hole 32.

Specifically, the self-formed diffusion barrier formed with the self-formed high-entropy alloy 4 may be amorphous solid solution at a bottom and a sidewall of the interconnect via 3 and have good bonding with the substrate 11 and the dielectric layer 12. The self-formed diffusion barrier formed with the self-formed high-entropy alloy 4 may be continuous, even and compact, its thickness may be within 1-2 nm, and it may have good thermal stability and barrier performance.

Specifically, the Cu seed layer 5 may be fixedly bonding to the diffusion barrier formed with the self-formed high-entropy alloy 4 continuously and compactly, and have less defects and good conductivity that facilitate later Cu plating process. The interconnect via 3 may be filled with a Cu electroplating layer 6, positioned on the Cu seed layer 5, to form the Cu interconnect; however, to obtain a Cu interconnect with a flat surface, a polish process may be performed.

The Cu interconnect having a diffusion barrier formed with the self-formed high-entropy alloy of the present embodiment overall has good thermal stability and uniformity and low resistivity to meet requirements of Cu interconnect.

Third Embodiment

The present embodiment provides a method of preparing a complementary metal oxide semiconductor (CMOS), the method may carry out a self-formed diffusion barrier formed with the self-formed high-entropy alloy and a Cu seed layer, mainly comprises steps of: providing a semiconductor substrate (comprising a silicon substrate); implanting shallow trench isolations (STI) on the semiconductor substrate, and a substrate area between the STI being active area (AA); ion-implanting the substrate to form a N well and a P well; preparing a gate electrode positioned on the AA; implanting a dopant into the AA at two sides of the gate electrode to form a source and a drain; forming a contact hole and forming silicide; and performing a metal interconnect process to form a Cu interconnect, details therein comprising: (7-1) depositing an inter-metal dielectric layer on the substrate prepared in aforesaid process, the formed dielectric layer and the substrate constructing a base; (7-2) through an etching process, forming an interconnect via in the dielectric layer, at least a sidewall of the interconnect via constructing a pre-depositing area; (7-3) applying a PVD or CVD process, co-depositing a high-entropy alloy having a plurality of chemical elements and Cu at an inner wall of the interconnect via; (7-4) at a temperature within 300~400° C., with an annealing furnace or a quick annealing furnace, performing a rapid thermal annealing process to simultaneously and automatically form the diffusion barrier formed with the self-formed high-entropy alloy and the Cu seed layer; wherein the diffusion barrier formed with the self-formed high-entropy alloy is formed at a surface of the pre-depositing area, the Cu seed layer is formed at a surface of the diffusion barrier formed with the self-formed high-entropy alloy; (7-5) plating a surface of the Cu seed layer to form a Cu electroplating layer, and applying a CMP process to planarize the Cu interconnect; (7-6) repeating aforesaid steps to preparing a plurality layers of the Cu interconnect.

As mentioned above, the method of preparing the Cu interconnect having the diffusion barrier formed with the self-formed high-entropy alloy according to the present embodiment, compared with traditional process having two steps to deposit a diffusion barrier and a Cu seed layer respectively, aforesaid process may simultaneously self-form the diffusion barrier formed with the self-formed high-entropy alloy and the Cu seed layer with a simple and efficient process and lower cost, that facilitates industrial production. The prepared diffusion barrier formed with the self-formed high-entropy alloy may be smaller in sizes to facilitate application of Cu in interconnect of integrated circuits to satisfy requirements of manufacturing microelectronical productions. The prepared diffusion barrier formed with the self-formed high-entropy alloy may have high bonding strength and barrier performance between the base and the Cu seed layer, so as to facilitate application of Cu in interconnect of integrated circuits.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. A method of preparing a Cu interconnect having a diffusion barrier formed with a self-formed high-entropy alloy, comprising steps of:
   providing a base, the base having a pre-depositing area;
   preparing a co-deposition material layer at the pre-depositing area, the co-deposition material layer is formed through co-depositing high-entropy alloy elements and Cu element;
   annealing the co-deposition material layer to simultaneously and automatically form the diffusion barrier formed with the self-formed high-entropy alloy and the Cu seed layer, wherein the diffusion barrier formed with the self-formed high-entropy alloy is formed on a surface of the pre-depositing area, the Cu seed layer is formed on a surface of the diffusion barrier formed with the self-formed high-entropy alloy; and
   electroplating the Cu seed layer to form a Cu electroplating layer to prepare the Cu interconnect.

2. The method of preparing a Cu interconnect having a diffusion barrier formed with a self-formed high-entropy alloy according to claim 1, wherein the step of preparing the co-deposition material layer further comprising:
   performing physical vapor deposition to co-deposit a membrane at the pre-depositing area with a high-entropy target and the Cu target.

3. The method of preparing a Cu interconnect having a diffusion barrier formed with a self-formed high-entropy alloy according to claim 2, wherein the high-entropy target is prepared through a hot isostatic pressing process.

4. The method of preparing a Cu interconnect having a diffusion barrier formed with a self-formed high-entropy alloy according to claim 1, wherein an annealing temperature is within 300-400° C.

5. The method of preparing a Cu interconnect having a diffusion barrier formed with a self-formed high-entropy alloy according to claim 4, wherein the step of annealing the co-deposition material layer is performed with a quick annealing furnace for rapid thermal annealing, and an annealing cooling rate is within 50~100° C./s.

6. The method of preparing a Cu interconnect having a diffusion barrier formed with a self-formed high-entropy alloy according to claim 1, wherein an interconnect via is formed in the base, and the pre-depositing area is constructed with at least a sidewall of the interconnect via.

7. A Cu interconnect having a diffusion barrier formed with a self-formed high-entropy alloy, comprising:
   a base, having a pre-depositing area;
   a diffusion barrier formed with the self-formed high-entropy alloy, self-formed at a surface of the pre-depositing area;
   a Cu seed layer, formed at a surface of the diffusion barrier formed with the self-formed high-entropy alloy; and
   a Cu electroplating layer, formed on the Cu seed layer to form the Cu interconnect.

8. The Cu interconnect having a diffusion barrier formed with a self-formed high-entropy alloy according to claim 7, wherein a thickness of the diffusion barrier formed with the self-formed high-entropy alloy is within 1~2 nm.

9. The Cu interconnect having a diffusion barrier formed with a self-formed high-entropy alloy according to claim 8, wherein the diffusion barrier formed with the self-formed high-entropy alloy is an amorphous solid solution.

10. The Cu interconnect having a diffusion barrier formed with a self-formed high-entropy alloy according to claim 9, wherein the diffusion barrier formed with a material of the self-formed high-entropy alloy is chosen from the group comprising TiVCrZrHf, VNbMoTaW, HfNbTaTiZr, $(TiZrNbCu)_{1-x}Ni_x$, AlMoNbSiTaTiVZ.

* * * * *